(12) United States Patent
Yang

(10) Patent No.: US 10,141,395 B2
(45) Date of Patent: Nov. 27, 2018

(54) HIGH-K METAL-INSULATOR-METAL CAPACITOR AND METHOD OF MANUFACTURING THE SAME

(71) Applicant: International Business Machines Corporation, Armonk, NY (US)

(72) Inventor: Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/832,898

(22) Filed: Dec. 6, 2017

(65) Prior Publication Data

US 2018/0122893 A1    May 3, 2018

Related U.S. Application Data

(63) Continuation of application No. 15/339,183, filed on Oct. 31, 2016, now Pat. No. 9,876,068.

(51) Int. Cl.
| | | |
|---|---|---|
| *H01L 29/00* | (2006.01) | |
| *H01L 21/8236* | (2006.01) | |
| *H01L 21/8242* | (2006.01) | |
| *H01L 21/20* | (2006.01) | |
| *H01L 49/02* | (2006.01) | |
| *H01L 21/768* | (2006.01) | |

(52) U.S. Cl.
CPC ........ *H01L 28/91* (2013.01); *H01L 21/76865* (2013.01); *H01L 28/87* (2013.01)

(58) Field of Classification Search
CPC .... H01L 21/76868; H01L 28/87; H01L 28/91
USPC .......................... 438/210, 253, 396; 257/534
See application file for complete search history.

(56) References Cited

U.S. PATENT DOCUMENTS

| | | |
|---|---|---|
| 5,675,184 A | 10/1997 | Matsubayashi et al. |
| 5,879,985 A | 3/1999 | Gambino et al. |
| 6,461,914 B1 | 10/2002 | Roberts et al. |
| 6,670,237 B1 | 12/2003 | Loh et al. |
| 6,764,915 B2 | 7/2004 | Lee |
| 2015/0221718 A1 | 8/2015 | Rhie |
| 2017/0213896 A1 | 7/2017 | Lisiansky |

*Primary Examiner* — David S Blum
(74) *Attorney, Agent, or Firm* — Jeffrey L. Kelly, Esq.; McGinn IP Law Group, PLLC

(57) ABSTRACT

A metal-insulator-metal (MIM) capacitor, includes a cross-sectional view: a first metal plate; a second metal plate; a third metal plate; and a layer of high-k material contacting the first metal plate, the second metal plate, and the third metal plate.

20 Claims, 9 Drawing Sheets

(Cross-section)

Post Planarization (CMP)

Post Patterning

Metal Liner Deposition

Removing Metal Liner from Horizontal Area
Through Directional Bombardment

High-k Deposition

Metal Fill

CMP

Dielectric Recess

Metal Liner Recess

Capping Layer Deposition

HIGH-K METAL-INSULATOR-METAL CAPACITOR AND METHOD OF MANUFACTURING THE SAME

This Application is a Continuation Application of U.S. patent application Ser. No. 15/339,183, now U.S. Pat. No. 9,876,068, filed on Oct. 31, 2016.

BACKGROUND

The present invention relates generally to a metal-insulator-metal (MIM) capacitor, and more particularly, to a configuration in which capacitor plate portions are formed on sidewall surfaces of a via, trench, or other cavity to provide a three-plate vertical MIM capacitor structure with only one patterning/mask fabrication process.

Capacitors are widely used in the semiconductor devices. Such capacitive structures include, for example, metal-oxide-semiconductor (MOS) capacitors, p-n junction capacitors and metal-insulator-metal (MIM) capacitors. MIM capacitors can provide certain advantages over MOS and p-n junction capacitors because the frequency characteristics of MOS and p-n junction capacitors may be restricted as a result of depletion layers that form in the semiconductor electrodes. A MIM capacitor can therefore exhibit improved frequency and temperature characteristics.

MIM capacitors are typically formed in successive metal interconnect layers of the back end of the line (BEOL) stage of the chip fabrication, the fabrication stage in which multiple metal interconnect layers interconnect the components and nodes, including components formed in the substrate during the front end of the line (FEOL) processing. Conventional MIM capacitors utilize a so-called "2-plate" structure in which the MIM capacitor includes two metal plates. Recently, techniques have considered a "3-plate" structure, which includes three metal plates, and that shows about twice the performance of 2-plate structures, as exemplarily shown in FIG. 1. As can be seen in FIG. 1 and for purpose of the present invention, the term "3-plate" refers to a MIM capacitor structure which, in cross section, includes two plate portions of one polarity of the capacitor electrically interconnected so as to surround or envelope on opposing sides a third plate portion of the opposite polarity of the capacitor, along with the dielectric material used to separate two capacitor plates of opposite polarities.

However, to one of ordinary skill, this "3-plate" structure 100 shown in FIG. 1 has a relatively complex fabrication that requires three additional masks, each including a lithography and reactive ion etching (RIE) process, which results in a relatively high manufacturing cost. In addition, there is a limited horizontal area on a chip, which can lead to performance or scaling challenges for this conventional 3-plate structure.

SUMMARY

In contrast to the 3-plate MIM capacitor 100 of FIG. 1, the present invention provides a method and structure forming an MIM capacitor that requires only one pattern to form the core plate portions characteristic of a 3-plate MIM capacitor. Because of the single pattern processing, as incorporated in conjunction with other BEOL processing for chip fabrication, the present invention provides this new structural approach with minimal disruption to the typical BEOL processing steps.

Additionally, the single-pattern method of the present invention provides a vertical component to the structure that permits the horizontal real estate of the chip to be better utilized, thereby providing a structure that permits greater density of MIM capacitors. The 3-plate vertical MIM capacitor of the present invention utilizes both horizontal and vertical surfaces in its formation of the opposite polarity plates.

In an exemplary embodiment, the present invention provides a metal-insulator-metal (MIM) capacitor, including, in a cross-sectional view a first metal plate, a second metal plate, a third metal plate, and a layer of high-k material contacting the first metal plate, the second metal plate, and the third metal plate in a manner achieved by using a single etching/mask pattern for an etching and deposition process to form the second metal plate, the third metal plate, the high-k material layer, and contact with the first metal plate.

In another exemplary embodiment, the present invention provides a metal-insulator-metal (MIM) capacitor constructed in a plurality of successive layers of a back-end-of-line (BEOL) layers in a semiconductor device, where the MIM capacitor includes a lower metal fill region formed to fill a cavity of a lower BEOL layer, the lower metal fill region serving as a bottom electrode contact for the MIM capacitor; an upper metal fill region formed to fill a cavity of an upper BEOL layer, the upper metal region serving as a top electrode contact for the MIM capacitor; and a core electrode structure formed to fill a cavity in at least one intermediate BEOL layer between the lower and upper BEOL layers. The core electrode structure includes a center metal fill region formed to fill a center of the cavity, to serve as a principle upper electrode plate for the MIM capacitor, the center metal fill region electrically connected to a bottom surface of the upper metal fill region formed in the upper BEOL layer; a layer of high-k dielectric material continuously surrounding the center metal fill region on side and bottom surfaces of the center metal fill region, the high-k dielectric material layer serving as a plate separation dielectric for the MIM capacitor; and a layer of liner metal lining sidewall surfaces of the cavity in the at least one intermediate BEOL layer, the layer of liner metal contacting an outer surface of the layer of high-k dielectric material, the layer of liner metal serving as a principle lower electrode plate for the MIM capacitor, the layer of liner metal electrically connected to a top surface of the lower metal fill region formed in the lower BEOL layer.

In a further exemplary embodiment, the present invention provides a semiconductor fabrication method including post patterning an insulation layer for an etch; using the post patterning as an etch mask, etching through the insulation layer to create a cavity that exposes a top surface of an underlying metal region, the exposed underlying metal region providing a lower contact for a lower electrode of a metal-insulator-metal (MIM) capacitor; using the post patterning as a mask and depositing a layer of liner metal on sidewall and bottom surfaces of the cavity, the layer of liner material contacting a top surface of the underlying metal region, the layer of liner material serving as a lower electrode plate for the MIM capacitor; using the post patterning as a mask and depositing a layer of low-k dielectric material, the layer of low-k dielectric material serving as a dielectric layer between the lower electrode plate and an upper electrode plate of the MIM capacitor; and using the post patterning as a mask and depositing, on a top surface of the low-k dielectric material, a layer of fill metal to provide a fill metal region serving as an upper electrode plate for the MIM capacitor that opposes the layer of liner material serving as the lower electrode plate for the MIM capacitor.

Other details and embodiments of the invention will be described below, so that the present contribution to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Aspects of the invention will be better understood from the following detailed description of the exemplary embodiments of the invention with reference to the drawings, in which.

DETAILED DESCRIPTION

Figure 1:
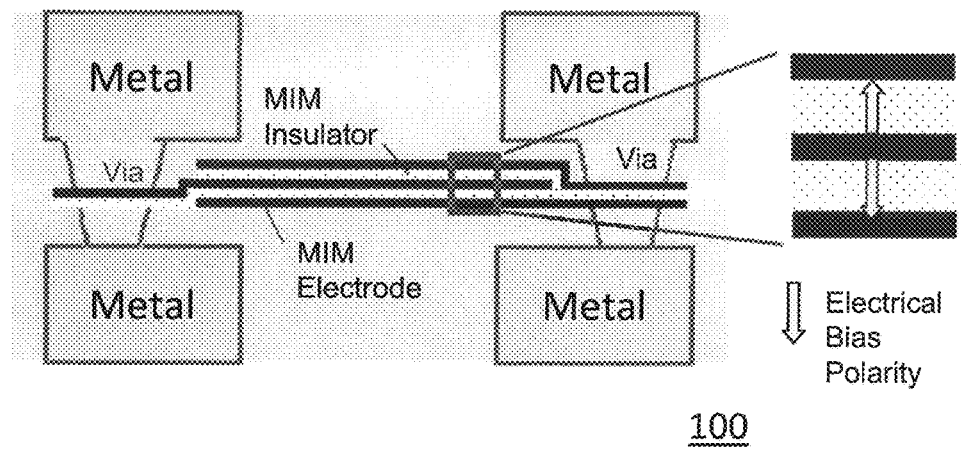
FIG. 1 is a vertical cross-sectional view showing one example of a conventional 3-plate metal-insulator-metal (MIM) capacitor 100.

The invention will now be described with reference to FIGS. 2-4, in which like reference numerals refer to like parts throughout. It is emphasized that, according to common practice, the various features of the drawing are not necessarily to scale. On the contrary, the dimensions of the various features can be arbitrarily expanded or reduced for clarity.

Figure 2:
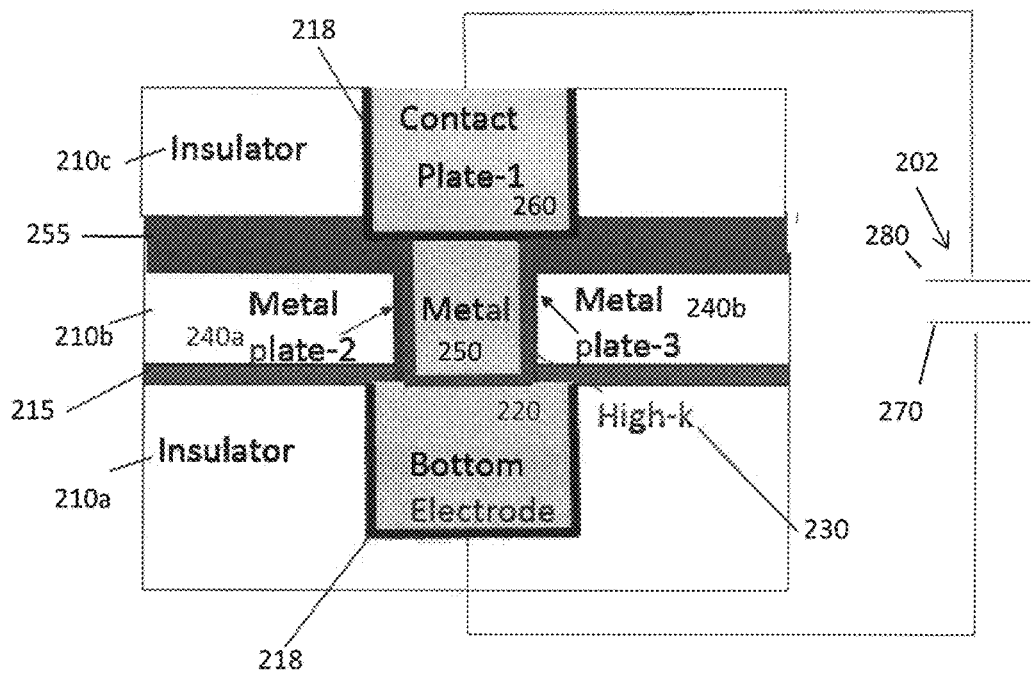
FIG. 2 shows a vertical cross-sectional view of a first exemplary embodiment 200 of the present invention.
Figure 4A:
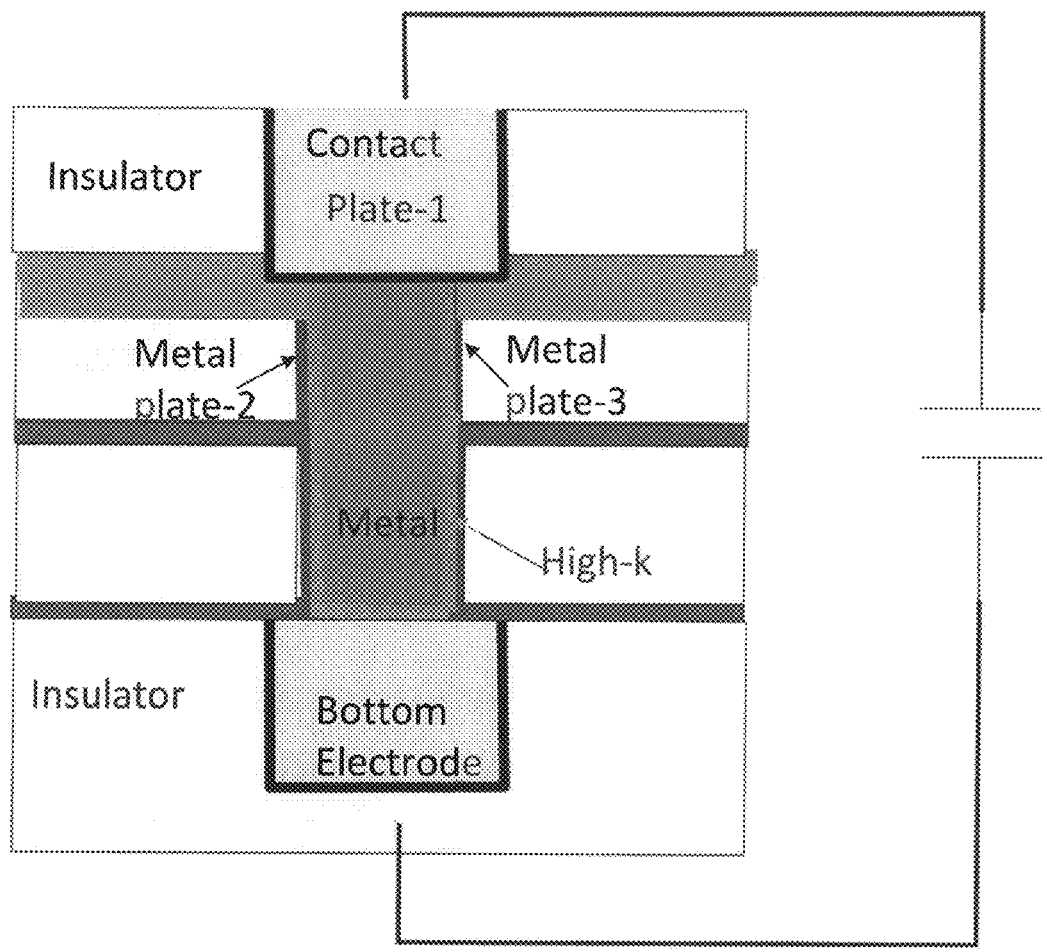
FIGS. 4A and 4B show exemplary variations of an exemplary second embodiments in which more than one middle layer form vertical plate portions providing the 3-plate features.
Figure 4B:
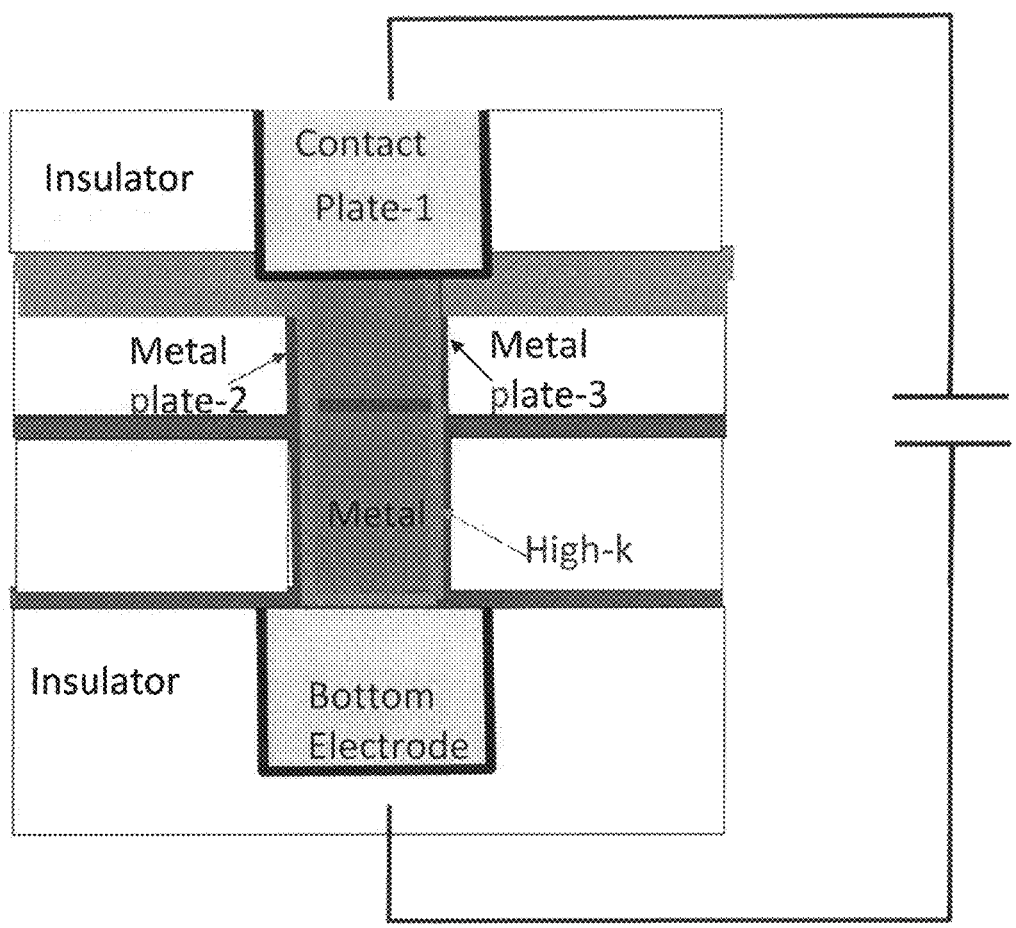

With reference now to FIG. 2, the MIM capacitor 200 of an exemplary embodiment is shown in cross section, along with the equivalent circuit shown as the capacitor icon 202 on the right side, which also thereby demonstrates the two connection points for the capacitor structure 200. The capacitor structure 200 in this exemplary embodiment is constructed in three successive layers of the BEOL stage of the wafer fabrication processing, although variations demonstrated by FIGS. 4A and 4B show how additional middle BEOL stage(s) could enhance the vertical aspect of the MIM structure. As is well known in the art, each BEOL layer consists of an insulator layer 210a, 210b, 210c, each typically topped by a cap layer 215, 255 and including various trenches of fill metal for wiring interconnects.

It is noted that the MIM capacitor 200 of the present invention is constructed during BEOL processing in parallel with the construction of other wiring interconnects being fabricated in each of the three BEOL layers shown in FIG. 2. Depending upon specific chip design, there can be an arbitrary number of successive BEOL layers used to form wiring interconnects between circuit components for the chip, although typically no more than 12 layers are necessary and it is common to use six layers. It is not particularly significant which specific BEOL layers are involved, but MIM capacitors typically are preferentially fabricated near the top of the BEOL stack in order to minimize parasitic capacitance with circuit components formed on the underlying chip. Thus, in a six-layer stack, the MIM capacitors might be formed around the metal 4 or 5 level (M4/M5) of the BEOL stack of layers. For purpose of explaining the present invention, the three BEOL insulator layers 210a, 210b, 210c will be referred to as the first or lower layer 210a, the second or middle layer 210b, and the third or upper layer 210c, without implication of which actual metal layers in the BEOL stack are involved.

As illustrated in FIG. 2, in the middle layer it can be seen that a layer of high-k material 230 lines the sidewalls and bottom surface of the cavity containing metal filler 250. This high-k layer 230, being an insulator material, provides the dielectric layer separating the equivalent capacitor plates 270, 280 of the MIM capacitor structure 200 shown in the equivalent circuit on the right of FIG. 2. So one component of plates of the capacitor structure 200 are the metal liner layers 240a, 240b, located more distal from the metal filler 250 than the high-k layer, while the opposing capacitor plate on the opposite side of the high-k layer 230 includes filler metal 250. As will be clear from description of the fabrication steps, these metal liner layers 240a, 240b, the high-k layer 230, and the metal fill 250 form the core of the 3-plate MIM structure of the present invention. It will also be clear that this core is formed using only one etch pattern and that such single pattern is possible because the present invention utilizes sidewall surface areas to form principle portions of capacitor plates.

FIG. 2 also shows that each of the metal layers 240a, 240b contacts the bottom electrode 220 of the capacitor structure 200, so that metal layer 240a, 240b and bottom electrode 220 can be recognized as forming the equivalent lower capacitor plate 270 of the MIM capacitor 200 structure, and the principle upper capacitor plate 280 becomes the metal filler 250 in the middle layer that is on the surface of the high-k layer 230 opposite to the metal layers 240a, 240b. Since this filler metal 250 also electrically contacts the contact plate-1 260 of the capacitor structure through metal diffusion barrier layer 218, the equivalent upper capacitor plate 280, of the capacitor structure 200 is the metal filler 250 and contact plate-1 260.

One of ordinary skill in the art would readily recognize that contact to the MIM capacitor structure 200 could be made using a via to contact either the upper or lower contact points 220, 250 or that either of the upper or lower contact points 220, 250 could already be part of wire interconnect(s) in the lower or upper BEOL layers, so that one end of a wire interconnect could inherently serve as a contact to the MIM capacitor structure 200.

In the cross-sectional view of FIG. 2, metal layer 240a is herein also referred to as "plate-2", and metal layer 240b is herein also referred to as "plate-3" even though plate-2 and plate-3 are electrically interconnected by reason that they both contact bottom electrode 220. It is noted that metal layers 240a, 240b are formed during the same metal deposition process, as will be clear when the fabrication of the device 200 is described below. As will also be clear when fabrication is described, the cavity or trench in which filler metal 250 is formed will have an additional dimensional aspect if the plan view is also considered. For example, in the plan view, the fill metal region 250 might be a via, a line similar to other wiring interconnects on this same layer, or other geometric shape. Thus, cross-sectional view of FIG. 2 is not necessarily drawn to scale, does not show the end portions of this cavity or trench, and does not, therefore, demonstrate that this same metal deposition process that formed metal layers 240a, 240b will also coat the front and aft end portions of the cavity/trench. So metal plate-2 and metal plate-3 are both actually part of a continuous metal layer that fully surrounds the sidewalls of this cavity/trench and are therefore also interconnected for this reason alone.

As shown in the cross-sectional view of FIG. 2, metal plate-2 240a and metal plate-3 240b are vertically-oriented relative to the surface of the underlying wafer and contact one surface of the high-k material 230 and are also vertically-oriented relative to top contact surface of the bottom electrode 220 and the bottom contact surface of the upper contact plate-1 260. Contact plate-1 260 is horizontally oriented and also contacts the top edge of the high-k material 230 by way of the diffusion barrier liner 218, as well as the top surface of the metal fill 250. That is, the high-k material 230 is substantially U-shaped in cross section so as to coat an entirety of the vertical surface area of each of the first metal plate 240a and the second metal plate 240b and covers an exposed portion of the bottom electrode 220. The height of the vertical portions of the high-k material 230 is greater than the height of each of the metal plates 240a/b to avoid shorting these metal plates 240a/b with contact plate-1 260. Each of the vertical portions of the high-k material 230 contacts a horizontal portion of the contact plate 260. Thus, contact plate-1 260, the metal plate-2 240a, and metal plate-3 240b, as viewed cross-sectionally, can be considered to form the three plates of a "three-plate" MIM capacitor 200. The vertically arranged metal plate-2 240a and metal plate-3 240b combined with the U-shaped high-k material 230 are formed using only one patterning/masking process.

The material of the first insulator 210a, the second insulator 210b, and the third insulator 210c may include, for example, silicon oxide, nitride, carbide, low-k dielectrics, etc. either alone or in combination, as is common to use in BEOL layers. Possible material of the bottom electrode 220, the metal fill 250, and the contact plate 260 includes, for example, copper (Cu), aluminum (Al), tungsten (W), ruthenium (Ru), iridium (Ir), rhodium (Rh), cobalt (Co), etc. either alone or in combination.

Metal liner 240a/240b can be titanium (Ti), tantalum (Ta), tungsten (W), ruthenium (Ru), cobalt (Co), iridium (Ir) or their nitrides or alloys. The metal liner layer 240a/240b can be deposited by a deposition process such as, for example, PVD, atomic layer deposition (ALD), chemical vapor deposition (CVD), plasma enhanced chemical vapor deposition (PECVD), sputtering, chemical solution deposition, or plating. The thickness of the metal liner layer generally ranges from 0.5 Angstroms to 250 Angstroms.

It is also noted that the structure of the bottom electrode 220 and contact plate 260 typically includes a metal diffusion barrier 218 layer. The diffusion barrier liner 218 may be composed of Ta, TaN, Ti, TiN, Ru, RuN, RuTa, RuTaN, W, WN or any other material commonly used in the art that serves as a barrier to prevent a subsequently-formed metal 220,260 or metal alloy from diffusing therethrough.

Referring to FIGS. 3A to 3K, an exemplary method of manufacturing the MIM capacitor 200 will now be explained.

Figure 3A:
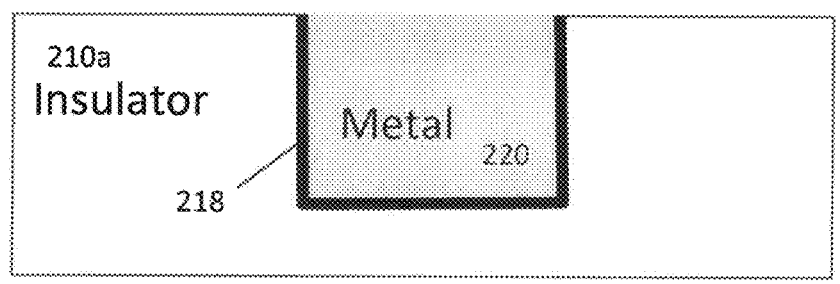
FIGS. 3A-3K are vertical cross-sectional views showing an examplary manufacturing process for the metal-insulator-metal (MIM) capacitor 200.

First, as shown in FIG. 3A, the first insulator 210a is provided as part of the lower BEOL layer. As is well known in the art, each BEOL layer will be patterned for an etch which will form cavities that will be filled by metal to form interconnects in that layer, typically with a metal diffusion barrier layer. FIG. 3A shows a cross section view in which the lower BEOL layer has the insulator layer 210a patterned to receive deposits for metal diffusion barrier layer 218 and for metal 220 as the bottom electrode of the MIM capacitor structure. FIG. 3A shows this first BEOL layer at the processing stage in which the overburden metal deposited to form the filler metal 220 has been polished off using CMP (chemical mechanical polishing). As is well known in the art, metal 220 has been deposited therein by sputtering such as chemical vapor deposition (CVD), plasma enhanced vapor deposition (PEVD), electroplating, etc., that fills the cavity voids with fill metal along with an overburden of fill metal on top of the layer that is removed by the CMP polish.

Figure 3B:
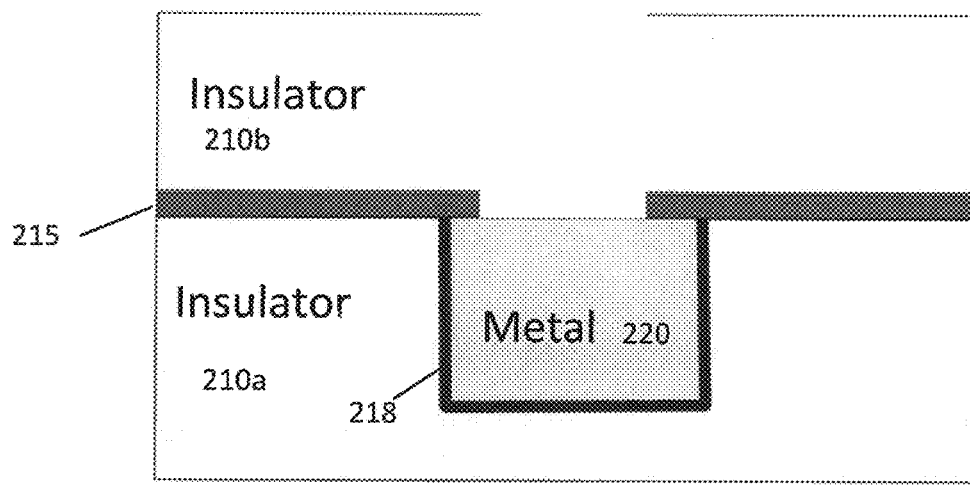

FIG. 3B shows the subsequent BEOL layer as a second insulator 210b deposited on cap layer 215 on the first insulator 210a. The second insulator 210b is an insulator formed on the cap layer 215 by using CVD, PVD, atomic layer deposition (ALD), combinations of the above or the like. The cap layer 215 can be one of a number of different insular materials commonly used in integrated circuit fabrication, for example, silicon dioxide ($SiO_2$), silicon nitride ($Si_3N_4$), silicon carbide (SiC), nitrogen and hydrogen doped silicon carbide SiC(N, H), or a doped glass layer, such as phosphorus silicate glass, boron silicate glass, and the like. In other embodiments, the cap layer 215 can be a low-k dielectric layer, wherein "low-k" generally refers to materials having a dielectric constant less than that of silicon dioxide ($SiO_2$). Depending upon the particular dielectric material, cap layer 215 can be formed by chemical vapor deposition deposited (CVD); plasma enhanced chemical vapor deposition (PECVD), atmospheric deposition, as well as spin-on techniques. In one or more embodiments, cap layer 215 is a chemical vapor deposited material, and all of these different possibilities are well known in the art.

Post patterning is performed on the second insulator 210b and the cap layer 215 to expose the metal 220, using any etch process well known in the art for BEOL processing, as appropriate for specific choices made for the various BEOL layer materials. It is noted that this one post patterning performed on the second insulator 200b in FIG. 3B is the only patterning necessary for forming the core components of the MIM capacitor structure 200. The cavity etched out can be either a vertical via or a horizontal line coming out of the paper, although it should be clear that any arbitrary shape (when viewed in plan view of the chip) could be used to form the capacitor structure. The exposed portion of the metal 220 (i.e., top surface) becomes a portion of the bottom plate (electrode) of the MIM capacitor.

Figure 3C:
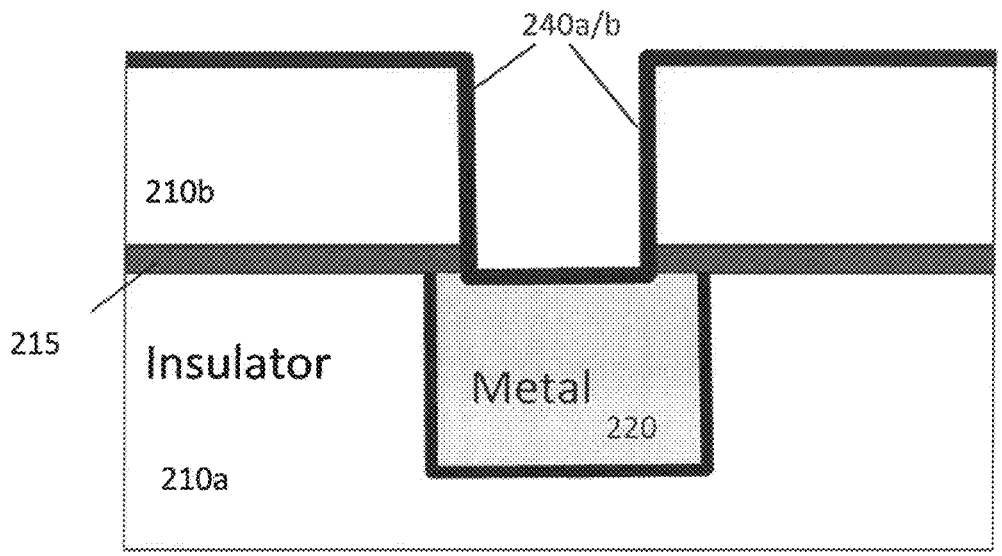

As shown in FIG. 3C, a metal liner layer 240a/b is then deposited on the surface of the second insulator 210b and, as noted above, preferably has a thickness between about 0.5 Angstroms to about 250 Angstroms. As previously explained, this metal liner layer 240a/b serves as the principle portion of the lower plate of the capacitor structure.

Figure 3D:
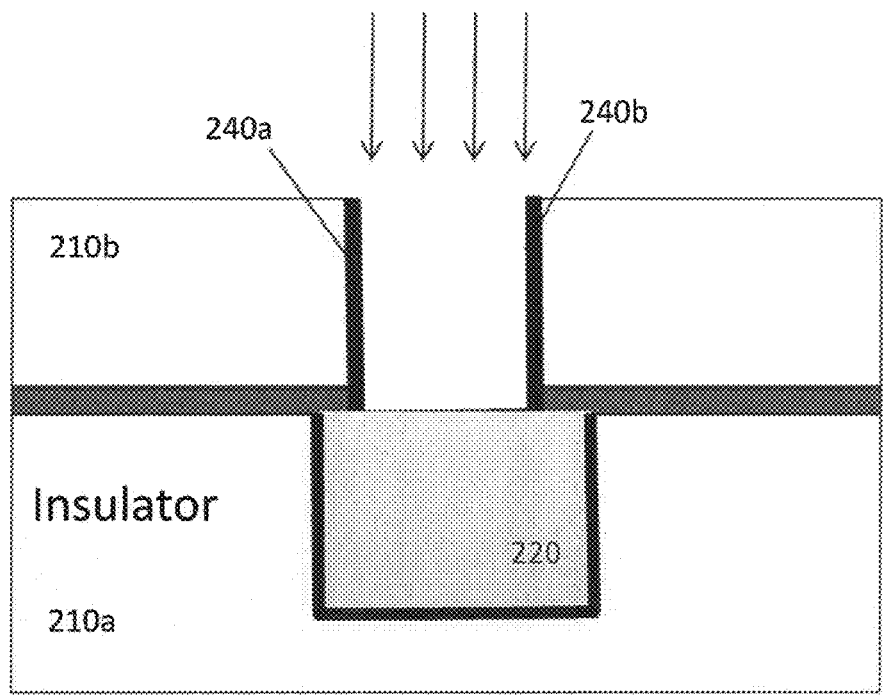

Next, as shown in FIG. 3D, in a first exemplary embodiment, the metal liner 140a/140b is removed from the horizontal area of the second insulator 110b through a directional bombardment such as directional sputtering, thereby leaving metal liner 140a/140b coating only the sidewalls of the cavity. The remaining metal liner lining the sidewalls of the cavity forms the metal plate-2 240a and metal plate-2 240b, the vertically oriented plates of the MIM capacitor structure.

However, it should be clear to one of ordinary skill in the art who has an understanding of capacitor structures that the removal of this metal liner at the bottom of the cavity is actually optional, since its presence will not impede the operation of a capacitor and, depending upon the choice of materials, its presence may provide a better conductive path to the bottom plate of the capacitor structure.

Therefore, even not shown in any figure, a second exemplary embodiment of the present invention is one in which the metal liner material 240a/b remains at the bottom of the cavity of the second BEOL layer. Along this same line of reasoning, it should be noted that the present invention structure can be also generalized somewhat by noting that a key novel feature of the present invention is that of forming a capacitor structure in which one of the polarity plates of the capacitor structure is formed in part by any conductor material that can be deposited in a manner to line the sidewalls of a cavity etched in a BEOL layer. Thus, the specific materials cited herein as forming the metal liner 240a/b should be considered as exemplary, since any conductive material appropriate to serve as a capacitor plate portion that can be deposited on sidewall surfaces of a cavity during BEOL processing could be used, based on specific design constraints of the desired capacitor structure.

Figure 3E:
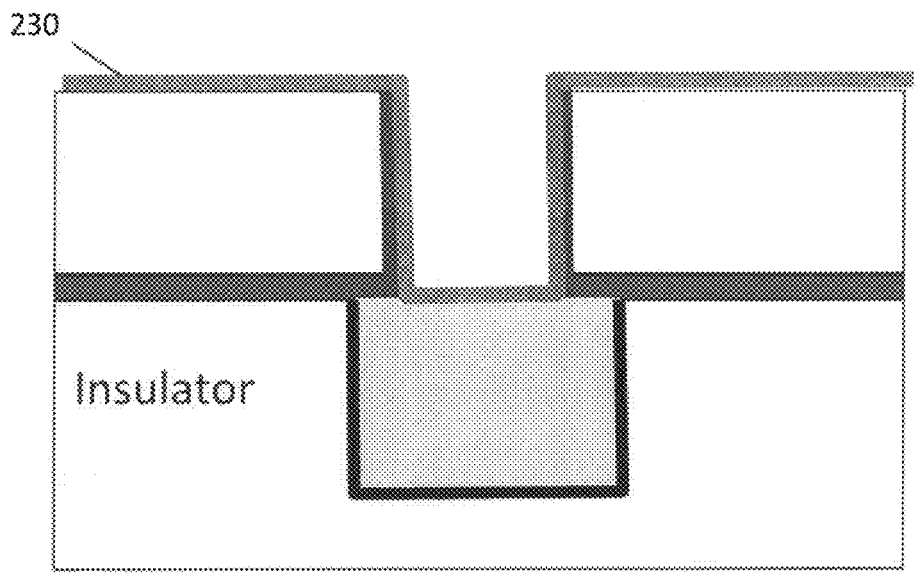

In FIG. 3E, high-k material 230 is deposited (via blanket processing using CVD, ALD, spin-on or PVD) on an entirety of the exposed portion of the second insulator 210b, metal plate-2 240a, metal plate-3 240b, and the underlying filler metal 220. A non-limiting list of common materials used for high-k in semiconductor fabrication include hafnium silicate ($Hf_{O2}$), zirconium silicate ($ZrSi_{O4}$), hafnium dioxide ($Hf_{O2}$), zirconium dioxide ($Zr_{O2}$), aluminum oxide ($Al_2O_3$), yttrium oxide ($Y_2O_3$), tantalum pentoxide ($Ta_2O_5$), lanthanum oxide ($La_2O_3$), silicon nitride ($Si_3N_4$), and titanium dioxide ($TiO_2$), and a number of these materials are typically deposited using atomic layer deposition. This high-k layer 230 serves as the dielectric that separates the two plates of the MIM capacitor structure 200.

Figure 3F:
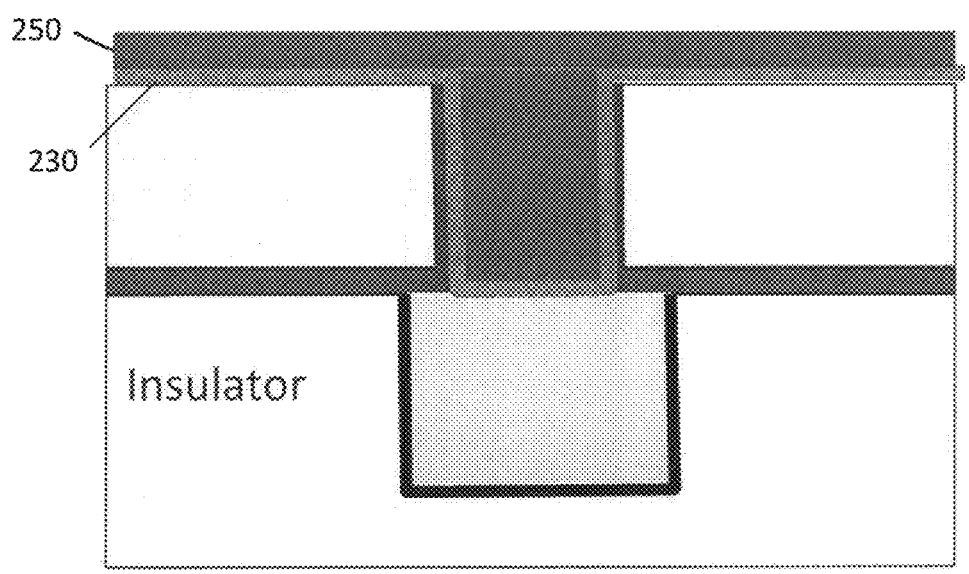

In FIG. 3F, fill metal is deposited (e.g., by a process such as by electroplating, PVD, CVD, ALD, or reflow) on the high-k material 230, coating the "walls" and "floor" of the second insulator 210b and coating the first metal plate 240a and the second metal plate 240b, followed by deposition of a fill metal 250. This metal fill region 250 serves as the second principle plate structure of the MIM capacitor, as opposing the first principle plate structure formed by the metal liner layer material 240a/b.

Figure 3G:
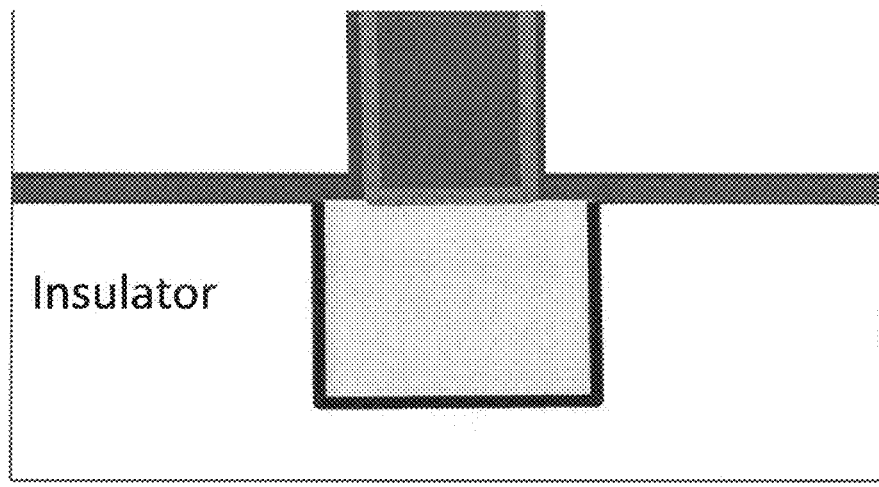

In FIG. 3G chemical mechanical polishing (CMP) is used to planarize the device back to the level in which are removed the portions of the high-k material 230, metal liner 240 (if not removed as shown in FIG. 3D) and the metal fill 250 outside of the via formed in the single patterning in FIG. 3B. As described earlier, after polishing, the remaining high-k material 230 in the via cavity forms the MIM capacitor's dielectric layer that separates the two opposing-polarity capacitor plate portions.

Thus, a distinguishing feature of the present invention is that, unlike the 3-plate capacitor 100 shown in FIG. 1, a single patterning process is used to form the core structure of the MIM capacitor structure 200 of the present invention. It is further noted that the metal liner layer 140a/b that forms a portion of the capacitor structure's metal plate in the core of the MIM capacitor could differ in composition from that of the metal filler 220, 250, 260 that is typically used in BEOL processing for metal interconnect structures. As applied in the exemplary embodiment of the present invention, the conventional metal filler material 220, 250, 260 is used to form the two contact areas 220, 260 for the MIM capacitor as well as providing a plate component 250 in the core of the structure that opposes the metal liner 240a/b.

Figure 3H:
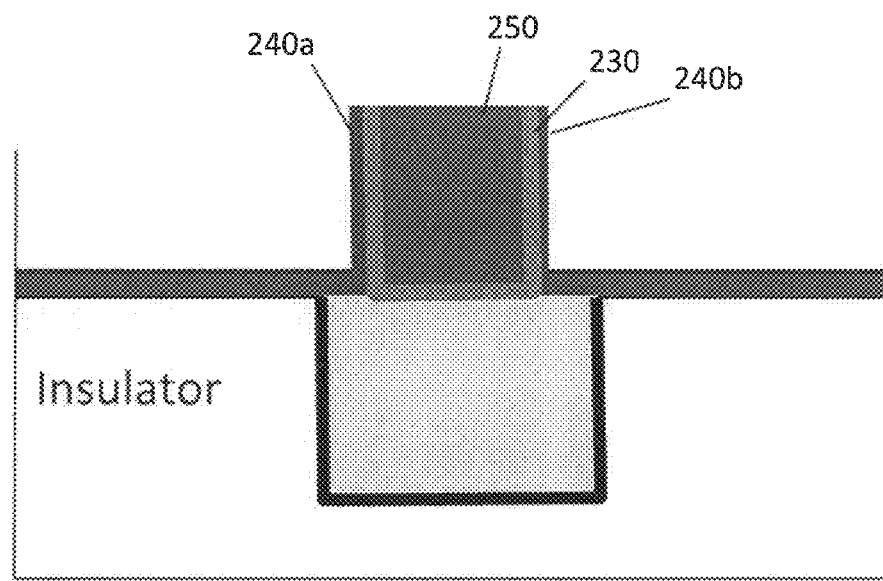

Next, as shown in FIG. 3H, a dielectric recess etch selectively removes a predetermined amount (e.g., predetermined etch time) top surface of the BEOL insulator layer as a two step process. First, a plasma damage etch, including at least one of oxygen (O), fluorine (F), chlorine (Cl), carbon monofluoride (CFx), argon (Ar), or helium (He) damages the upper surface. Second, a wet removal step removes the damaged layer, using dilute HF (hydrofluoric acid).

Figure 3I:
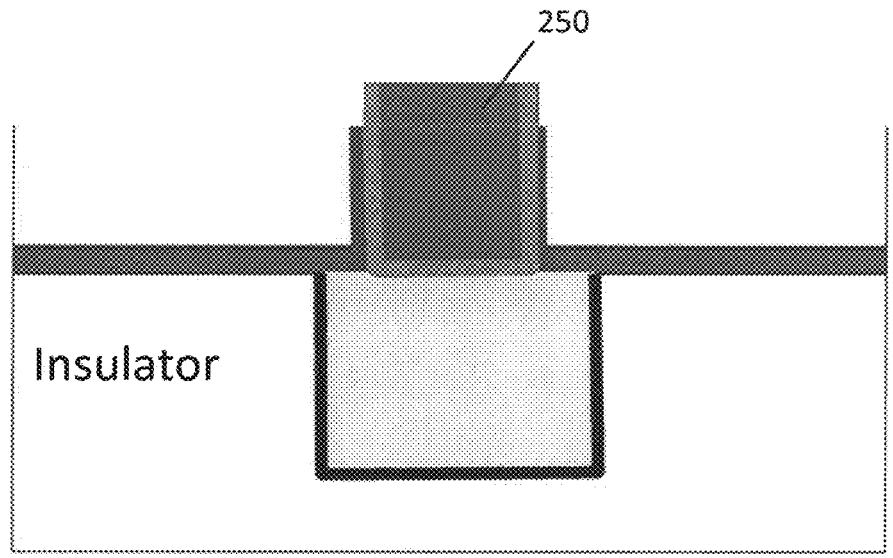
Figure 3J:
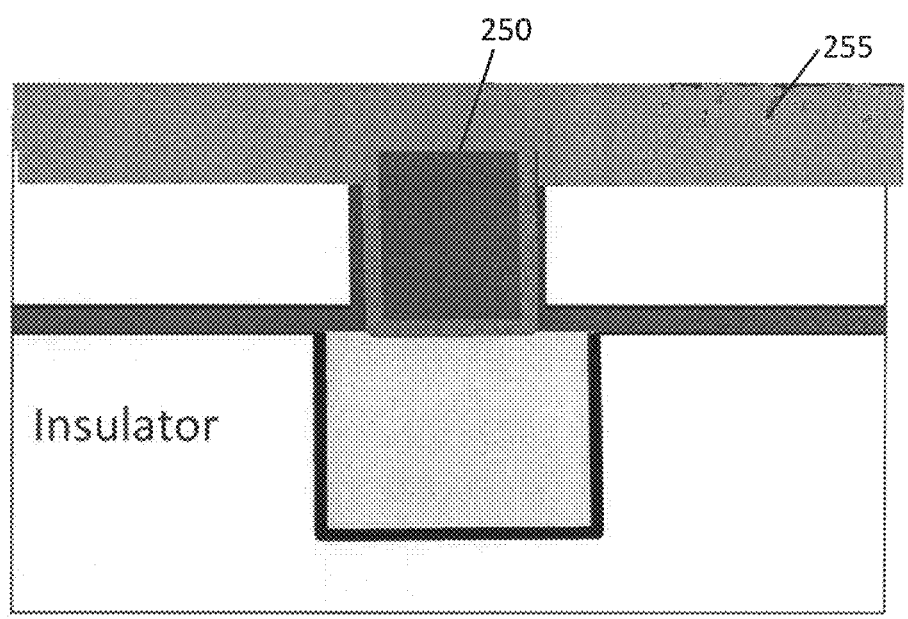

The metal liner recess etch shown in FIG. 3I is a wet removal of the metal liner and can be done using a mixture of $H_2O_2$ (e.g., hydrogen peroxide, used as an oxidizing agent during the selective removal process) with at least one of HCl (hydrochloric acid), H2SO4 (sulfuric acid), HF (hydrofluoric acid), HNO4 (peroxynitric acid). FIG. 3J shows the capping layer 155 deposition.

Figure 3K:
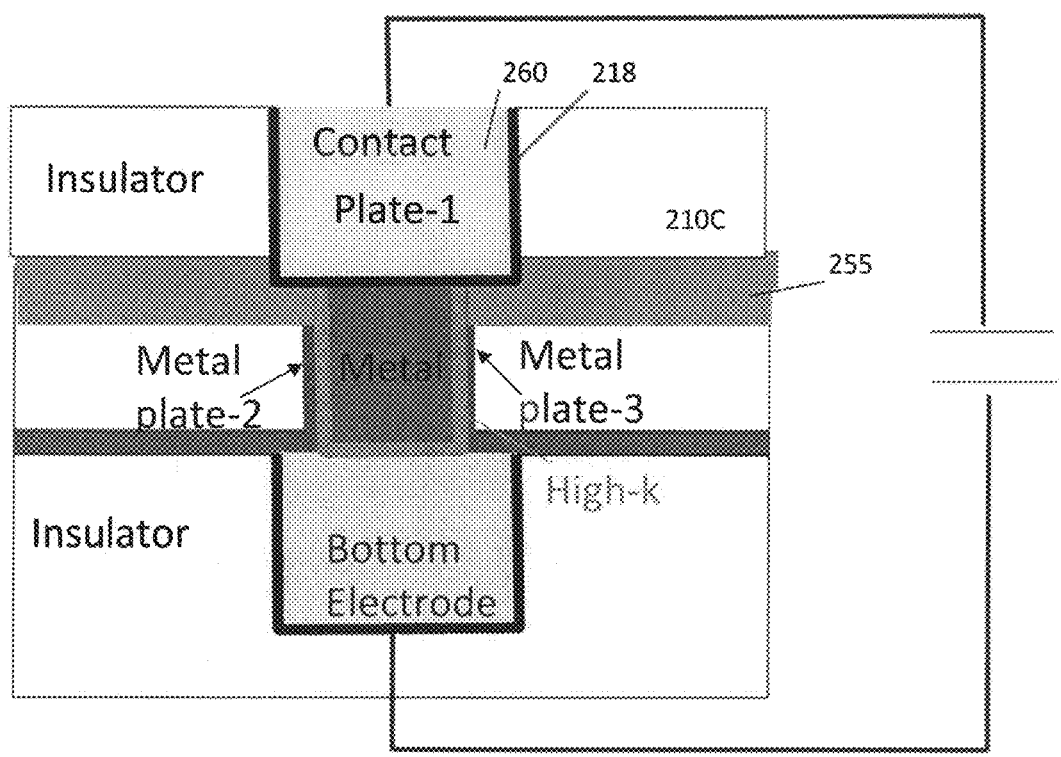

Finally, as shown in FIG. 3K, the top BEOL layer used in the MIM capacitor fabrication is formed by depositing a third insulating layer 210c, which is then etched to provide a cavity into which is deposited liner material 218 and filler metal 260, which provides the second connection point for the MIM capacitor structure 200. As well known in the art, the deposition of liner 218 and filler metal 260 will be followed by a CMP process to provide a planar surface for any subsequent BEOL layers that might be appropriate in specific chip designs.

Although FIGS. 2-3K show that the lower and upper contact metal fill regions 220, 260 are somewhat similar in size to the core structure of the middle layer, such similarity is not significant to the present invention, since the core structure of the middle layer(s) could be either substantially smaller or larger than the top/bottom contacts 220, 260.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments, such as the exemplary embodiment in which the metal liner layer on the bottom of the cavity of the second BEOL layer remains, as shown in FIG. 3C, rather than being etched away by the directional bombardment shown in FIG. 3D.

FIGS. 4A and 4B show one possible exemplary variation 400 in which multiple (e.g., at least two) middle BEOL layers are used to thereby provide additional vertical surface area for the core structure of the MIM capacitor structure. It should be clear to one of ordinary skill in the art that any number of such middle BEOL layers could be used and that continuity in the metal liner layer 140a/b, high-k dielectric layer 230, and metal filler 250 would be easily obtained by using the single patterning processing described above, with the following exceptions.

First, the metal liner recess etching described in FIG. 3H would be done only for the top middle BEOL layer and the capping layer in any middle BEOL layer other than the top middle BEOL layer is selectively etched away to permit the metal liner plate material 240A, 240B, the high-k material 230, and the filler metal 250 to be built up in successive middle BEOL layers.

Second, the high-k material in each additional middle BEOL layer would be directionally etched to remove the bottom section, in order to permit the metal core 250 to be continuous in the intermediate layer stack. The bottom portion of the metal liner material of each additional middle BEOL layer could also be directionally etched away, as shown in FIG. 4A. Alternatively, as shown in FIG. 4B, the metal liner bottom portion could be left in the stack of filler metal 250 since this metal liner material is conductive and would not interfere with the conductivity of the stack of filler metal 250.

It is noted that the terminology used herein was chosen to best explain the principles of the embodiments, the practical application or technical improvement over technologies found in the marketplace, or to enable others of ordinary skill in the art to understand the embodiments disclosed herein. Further, Applicant's intent is to encompass the equivalents of all claim elements, and no amendment to any claim of the present application should be construed as a disclaimer of any interest in or right to an equivalent of any element or feature of the amended claim.

What is claimed is:

1. A metal-insulator-metal (MIM) capacitor, comprising, in a cross-sectional view:
   a first metal plate;
   a second metal plate;
   a third metal plate; and
   a layer of high-k material contacting the first metal plate, the second metal plate, and the third metal plate.

2. The MIM capacitor of claim 1, wherein a single etching/mask pattern is used for etching and deposition and allows the second and third metal plates to be vertically-oriented relative to a horizontal surface of the first metal plate.

3. The MIM capacitor of claim 1, wherein the second and third metal plates comprise a metal different from that of the first metal plate.

4. The MIM capacitor of claim 1, wherein the layer of high-k material surrounds bottom and side surfaces of a region of metal fill that serves as an upper capacitor plate of the MIM capacitor and that opposes a lower capacitor plate comprising the second and third metal plates, and wherein a single etching/mask pattern serves to deposit a fill metal material into the metal fill region.

5. The MIM capacitor of claim 1, as formed in successive back-end-of-line (BEOL) layers of a semiconductor device, said MIM capacitor further comprising a bottom electrode contact in a first BEOL layer, the bottom electrode contact comprising a metal contact for connecting to a lower electrode plate of the MIM capacitor, the lower electrode plate comprising the second and third metal plates, wherein:
   the first metal plate comprises a bottom surface of a top electrode contact for the MIM capacitor, the top electrode contact being located in an upper BEOL layer above the first BEOL layer,
   the second and third metal plates and the layer of high-k material are located in at least one intermediate BEOL layer between the first BEOL layer and the upper BEOL layer, and
   the at least one intermediate BEOL layer further includes a metal filler region contacting a surface of the high-k material layer that is opposite to a surface that contacts the second and third metal plates, the metal filler region thereby forming an upper electrode plate for the MIM capacitor as separated from the lower electrode plate by the high-k material layer serving as a plate dielectric spacer.

6. The MIM capacitor of claim 5, wherein the at least one intermediate BEOL layer comprises a plurality of intermediate BEOL layers and each intermediate BEOL layer uses a single etching/mask pattern for an etching and deposition process to form said second and third metal plates and said high-k material layer in each intermediate BEOL layer in a manner that the second and third metal plates and the high-k material layer are respectively continuous components throughout the plurality of intermediate BEOL layers.

7. The MIM capacitor of claim 5, wherein the high-k material layer is approximately U-shaped in the cross-sectional view, and surrounds the metal filler region on three surfaces being side and bottom surfaces and excluding a top surface of the metal filler region.

8. The MIM capacitor of claim 5, wherein the second and third metal plates are interconnected as a single plate forming, in the cross-sectional view, a substantially U-shaped metal plate that surrounds the high-k material layer on three surfaces being side and bottom surfaces of the high-k material layer.

9. The MIM capacitor of claim 5, wherein the second and third metal plates, in the cross-sectional view, contact the high-k material layer only on side surfaces of the high-k material layer.

10. A semiconductor device comprising at least one metal-insulator-metal (MIM) capacitor constructed in a plurality of successive layers of a back-end-of-line (BEOL) layers in said semiconductor device, said MIM capacitor comprising:
    a lower metal fill region formed to fill a cavity of a lower BEOL layer, the lower metal fill region serving as a bottom electrode contact for the MIM capacitor;
    an upper metal fill region formed to fill a cavity of an upper BEOL layer, the upper metal region serving as a top electrode contact for the MIM capacitor; and
    a core electrode structure formed to fill a cavity in at least one intermediate BEOL layer between the lower and upper BEOL layers, the core electrode structure comprising:
       a center metal fill region formed to fill a center of the cavity, to serve as a principle upper electrode plate for the MIM capacitor, the center metal fill region electrically connected to a bottom surface of the upper metal fill region formed in the upper BEOL layer;
       a layer of high-k dielectric material continuously surrounding the center metal fill region on side and bottom surfaces of the center metal fill region, the high-k dielectric material layer serving as a plate separation dielectric for the MIM capacitor; and
       a layer of liner metal lining sidewall surfaces of the cavity in the at least one intermediate BEOL layer, the layer of liner metal contacting an outer surface of the layer of high-k dielectric material, the layer of liner metal serving as a principle lower electrode plate for the MIM capacitor, the layer of liner metal electrically connected to a top surface of the lower metal fill region formed in the lower BEOL layer.

11. The semiconductor device of claim 10, wherein the core electrode structure of the MIM capacitor is formed using a single pattern for an etching of a BEOL layer material to etch the cavity for the core electrode structure and for depositions of materials forming components of the core electrode structure.

12. The semiconductor device of claim 10, wherein a same first metal material is used to form the lower, center, and upper metal fill regions of the MIM capacitor, and wherein the first metal material is different from a second metal material used to form the layer of liner metal serving as the principle lower electrode plate.

13. The semiconductor device of claim 10, wherein the at least one intermediate BEOL layer comprises a single BEOL layer.

14. The semiconductor device of claim 10, wherein the at least one intermediate BEOL layer comprises a plurality of BEOL layers.

15. The semiconductor device of claim 10, wherein the layer of metal liner material lining sidewall surfaces of the cavity in the at least one intermediate BEOL layer provides a vertical plate portion for the principle lower electrode plate for the MIM capacitor, and wherein the principle upper electrode plate for the MIM capacitor has a horizontal plate portion comprising the lower surface of the upper metal fill region electrically connected to the top surface of the center metal fill region.

16. A method of fabricating a metal-insulator-metal (MIM) capacitor, said method comprising:
   post patterning an insulation layer for an etch;
   using the post patterning as an etch mask, etching through the insulation layer to create a cavity that exposes a top surface of an underlying metal region, the exposed underlying metal region providing a lower contact for a lower electrode of the metal-insulator-metal (MIM) capacitor;
   using the post patterning as a mask and depositing a layer of liner metal on sidewall and bottom surfaces of the cavity, the layer of liner material contacting a top surface of the underlying metal region, the layer of liner material serving as a lower electrode plate for the MIM capacitor;
   using the post patterning as a mask and depositing a layer of low-k dielectric material, the layer of low-k dielectric material serving as a dielectric layer between the lower electrode plate and an upper electrode plate of the MIM capacitor; and
   using the post patterning as a mask and depositing, on a top surface of the low-k dielectric material, a layer of fill metal to provide a fill metal region serving as an upper electrode plate for the MIM capacitor that opposes the layer of liner material serving as the lower electrode plate for the MIM capacitor.

17. The method of claim 16, further comprising, after the depositing the layer of liner metal but before the deposing the layer of low-k dielectric material, using the post patterning as a mask for a directional etch to selectively remove a bottom portion of the layer of liner metal.

18. The method of claim 16, as implemented in a back-end-of-line (BEOL) process, wherein the underlying metal region that is exposed is embedded in a lower BEOL layer and the layer that is etched-through comprises an intermediate BEOL layer, and wherein the method further comprises:
   using a chemical mechanical polishing (CMP) to remove an overburden of fill metal on a top surface of the intermediate BEOL layer and to planarize the top surface thereof;
   using a plasma damage and wet removal of a predetermined amount of the planarized top surface of the layer that is etched-through, to implement a dielectric recess;
   implementing a metal liner recess by using a wet etch to remove a portion of metal liner material exposed by the dielectric recess;
   depositing a capping layer over the top surface of the intermediate BEOL layer;
   depositing an insulation layer as an upper BEOL layer, on top of the capping layer;
   etching through the insulation layer of the upper BEOL layer and the capping layer of the intermediate BEOL layer to expose an upper surface of the fill metal region functioning as the upper electrode plate of the MIM capacitor; and
   depositing a layer of fill metal to provide a fill metal region to serve as an upper electrode contact for the MIM capacitor.

19. The method of claim 16, as implemented in a back-end-of-line (BEOL) process, wherein the underlying metal region that is exposed is embedded in a lower BEOL layer and the layer that is etched-through comprises a first intermediate BEOL layer, and wherein the method further comprises:
   using a chemical mechanical polishing (CMP) to remove an overburden of fill metal on a top surface of the first intermediate BEOL layer and to planarize the top surface thereof;
   depositing a capping layer over the planarized top surface of the first intermediate BEOL layer;
   depositing an insulation layer on top of the capping layer of the first intermediate BEOL layer, the deposited insulation comprising a second intermediate BEOL layer;
   post patterning the deposited insulation layer of the second intermediate BEOL layer for an etch, using the same post patterning as used for the first intermediate BEOL layer;
   using the post patterning as an etch mask, etching through the insulation layer the second intermediate BEOL layer and the capping layer of the first intermediate BEOL layer to create a cavity that exposes a top surface of the fill metal region in the first intermediate BEOL layer, a top edge surface of the layer of low-k dielectric material, and a top edged surface of the layer of liner metal functioning as the upper electrode plate of the MIM capacitor;
   using the post patterning as a mask and depositing a layer of liner metal on sidewall and bottom surfaces of the cavity of the second intermediate BEOL layer, the layer of liner material contacting the exposed top edge surface of the underlying layer of liner material, the layer of liner material of the first and second intermediate BEOL layers to serve as a lower electrode plate for the MIM capacitor;
   using the post patterning as a mask and depositing a layer of low-k dielectric material, the layer of low-k dielectric material contacting the exposed top edged surface of the underlying layer of low-k dielectric material;
   using the post patterning as an etch mask, directionally etching a bottom portion of the layer of low-k dielectric material, the directional etch removing a bottom portion of the deposited layer of low-k dielectric material and exposing a top surface of the fill metal region of the first intermediate BEOL layer, the layer of low-k dielectric material of the first and second intermediate BEOL layers to serve as a dielectric layer between the lower electrode plate and an upper electrode plate of the MIM capacitor;
   using the post patterning as a mask and depositing, on a top surface of the fill metal region of the first intermediate BEOL layer, another layer of fill metal, to provide a fill metal region to function as an upper electrode plate for the MIM capacitor that opposes the layer of liner material serving as the lower electrode plate for the MIM capacitor; and
   doing a CMP to remove an overburden of fill metal on a top surface of the second intermediate BEOL layer and to planarize the top surface.

20. The method of claim 19, further comprising:
using a plasma damage and wet removal of a predetermined amount of the planarized top surface of the second intermediate BEOL layer, to implement a dielectric recess;
implementing a metal liner recess by using a wet etch to remove a portion of metal liner material exposed by the dielectric recess;
depositing a capping layer over the top surface of the second intermediate BEOL layer;
depositing an insulation layer as a upper BEOL layer, on top of the capping layer;
etching through the insulation layer of the upper BEOL layer and the capping layer of the second intermediate BEOL layer to expose an upper surface of the fill metal region functioning as the upper electrode plate of the MIM capacitor; and
depositing a layer of fill metal to provide a fill metal region to serve as an upper electrode contact for the MIM capacitor.

* * * * *